United States Patent [19]
Langer

[11] Patent Number: 5,966,038
[45] Date of Patent: Oct. 12, 1999

[54] CIRCUIT WITH OVERVOLTAGE PROTECTION

[75] Inventor: Jiri Langer, Prague 2, Czech Rep.

[73] Assignee: Motorola, Inc., Schaumburg, Ill.

[21] Appl. No.: 08/990,596

[22] Filed: Dec. 15, 1997

[51] Int. Cl.⁶ ................................................... H03K 5/08

[52] U.S. Cl. ........................................ 327/328; 327/313

[58] Field of Search .................................. 327/313, 327, 327/328, 534; 361/56, 91

[56] References Cited

U.S. PATENT DOCUMENTS

| | | | |
|---|---|---|---|
| 4,199,695 | 4/1980 | Cook et al. . | |
| 4,347,447 | 8/1982 | Proebsting . | |
| 4,521,698 | 6/1985 | Taylor . | |
| 4,847,522 | 7/1989 | Fuller et al. | 326/58 |
| 4,858,055 | 8/1989 | Okitaka | 361/91 |
| 5,341,340 | 8/1994 | Hagura | 365/226 |
| 5,347,179 | 9/1994 | Casper et al. . | |
| 5,387,830 | 2/1995 | Kukimoto | 327/322 |
| 5,557,231 | 9/1996 | Yamaguchi et al. | 327/534 |
| 5,689,209 | 11/1997 | Williams et al. | 327/425 |
| 5,821,796 | 10/1998 | Yaklin et al. | 327/313 |

FOREIGN PATENT DOCUMENTS

0414354   4/1994   European Pat. Off. .

OTHER PUBLICATIONS

Whitaker, J. C. (editor): "The Electronics Handbook", Technical Press, Beaverton, Oregon, 1996, ISBN 0–8493–8345–5, chapter 47.3 "CMOS Logic"on pp. 679–683.

Horowitz, P., Hill, W.: "The Art of Electronics", Second Edition, Cambridge University Press, 1989, ISBN 0–521–37095–7, chapter 14.16 "Keeping CMOS Low Power" on pp. 970–974.

Yusuf Leblebici, "Design Considerations for CMOS Digital Circuits with improved hot–carrier reliability", IEEE Journal of Solid State Circuits, vol. 31, No. 7, Jul. 1996, pp. 1014–1024.

*Primary Examiner*—Terry D. Cunningham
*Attorney, Agent, or Firm*—Robert M. Handy; Rennie W. Dover

[57] ABSTRACT

A circuit (100) has a pull-up transistor (110), a pull-down transistor (120), an input driver (200). The pull transistors (110, 120) pull an output line (102) to first or second reference lines (101, 103). The output line (102) can assume a potential higher than the potential at the first reference line (101). The circuit (100) further comprises protection transistors (150, 160, 170, 180). The protection transistors compare the potential at the output line (102) with the potential at the first reference line (101). The protection transistors keep a substrate line (106) of the pull-up transistor (110) at the potential of the output line (102) or at the potential of the first reference line (101), whichever is higher.

21 Claims, 4 Drawing Sheets

CIRCUIT WITH OVERVOLTAGE PROTECTION

FIELD OF THE INVENTION

The present invention generally relates to electronic circuits, and, more particularly to input-output circuits and to a method for operating input-output circuits.

BACKGROUND OF THE INVENTION

Users of modern electronic devices, such as, for example, portable computers, mobile phones, accessories therefore, etc. appreciate robustness and high reliability, long battery lifetimes, compatibility between the devices and other features. Advances in very large scale integration (VLSI) fabrication techniques for integrated circuits (IC) are often based on reduced transistor dimensions (e.g., channel length) without a proportional scaling of the supply voltages. The reduction of critical transistor dimensions results in a significant increase of the electrical fields in the transistors. Also, circuits with different supply voltages might be connected to each other. For example, a first circuit (hereinafter conveniently called "interface") operates at a low supply voltage VCCL (e.g., 3.3 volts, "L" for "low") and controls a second circuit (e.g., a computer) operating at a higher supply voltage VCCH (e.g., 5 volts, "H" for "high"). The computer might from time to time pull outputs nodes of the interface to the high voltage VCCH. Thereby, the voltage VCCH from the computer goes partly into the interface and becomes an "overvoltage" for the interface. To avoid damages at, for example, output transistors at the interface, a further propagation of the high voltage VCCH should be avoided. The output transistors themselves should also accommodate VCCH. Leakage currents flow from the computer (at VCCH) back to the interface (at VCCL) and contribute to parasitic power consumption. The interface should be protected from overvoltages even if its supply voltage is grounded (at e.g., zero volts) or floating.

CMOS-circuits have inherently parasitic bipolar transistors and thyristors which form silicon controlled rectifiers (SCR). Under overvoltage conditions, these SCR can cause unwanted effect known as "latch-up". The following references give more details: [1] Whitaker, J. C. (editor): "The Electronics Handbook", Technical Press, Beaverton, Oreg., 1996, ISBN 0-8493-8345-5, chapter 47.3 "CMOS Logic" on pages 679–683; and [2] Horowitz, P., Hill, W.: "The Art of Electronics", Second Edition, Cambridge University Press, 1989, ISBN 0-521-37095-7, chapter 14.16 "Keeping CMOS Low Power" on pages 970–974. Circuits are, for example, described in European Patent 414 353 B 1 to Lundberg [3]; and in U.S. Pat. No. 4,521,698 to Taylor [4]. Some circuits employ enhancement and depletion transistors. Such solutions require cost intensive manufacturing steps to implement the depletion transistors.

Hence, the present invention seeks to provide an improved circuit and a method which mitigate or avoid these and other disadvantages and limitations of the prior art.

DETAILED DESCRIPTION OF A PREFERRED EMBODIMENT

Figure 1:
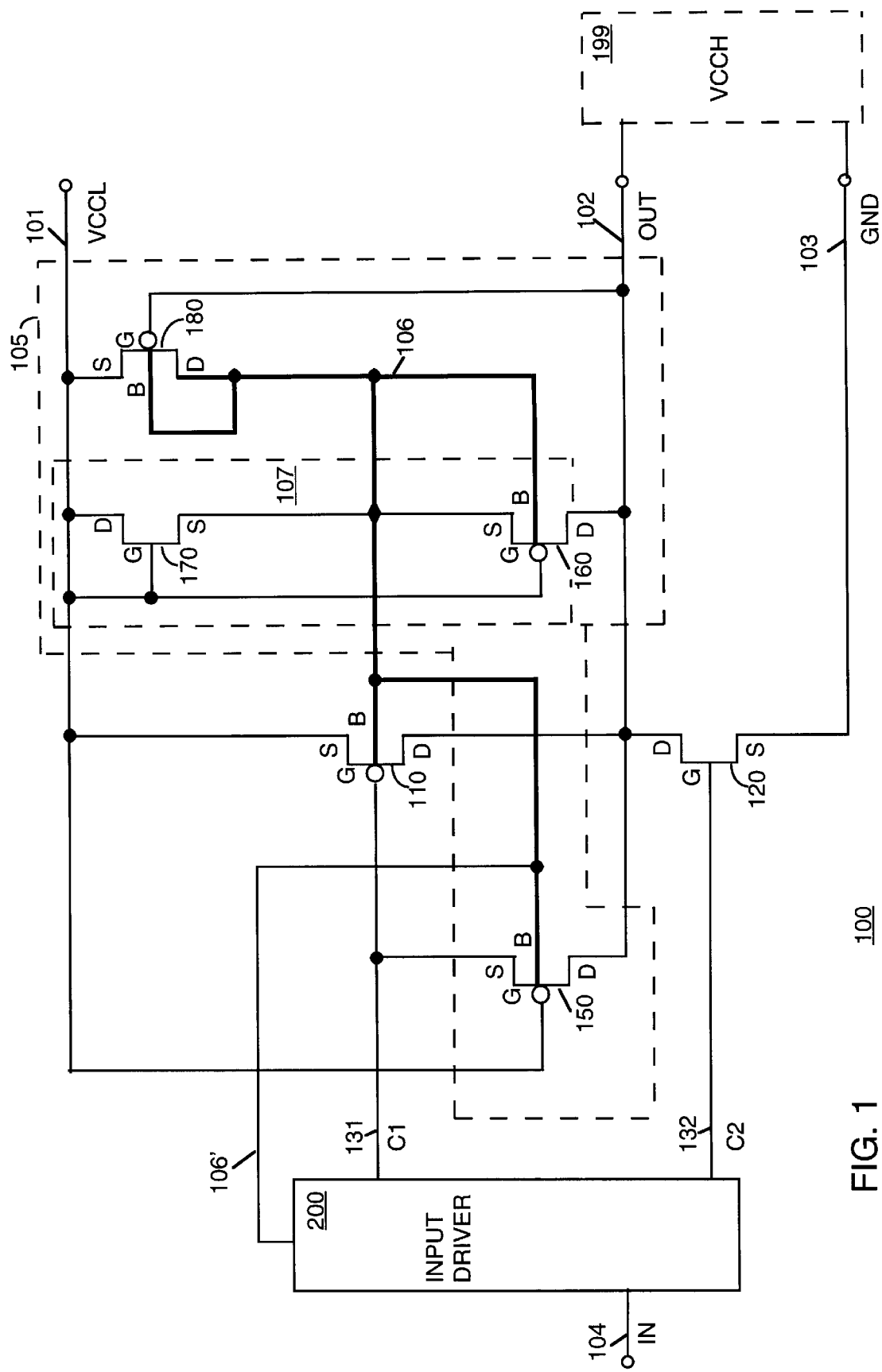
FIG. 1 is a simplified circuit diagram of a circuit according to the present invention.

FIG. 1 is a simplified circuit diagram of circuit 100 according to the present invention. FIG. 1 also illustrates that circuit 100 can be coupled to further circuit 199 (dashed). Before explaining details of the present invention, conventions used herein are explained. Circuit 100 and its embodiments are, preferably, implemented by transistors, such as transistors 110 and 120. The term "transistor" is intended to include any device having at least two main electrodes and a control electrode which is controlled by a signal applied to the control electrode. Transistors are, preferably, implemented on semiconductor substrates. A substrate electrode can sometimes by coupled within the circuit.

(a) The transistors used to implement the present invention are, preferably, field effect transistors (FET) having a source (S) and a drain (D) as main electrodes and a gate (G) as control electrode. For convenience, the abbreviations S, D and G appear also in the figures. A substrate electrode is identified by the letter "B" for "bulk" used as a synonym. The substrate is also called a "well region". Since FETs are typically symmetrical components, the true designation of "source" and "drain" is only possible once a voltage is impressed on the terminals. The designation of sources (S) and drains (D) herein should therefore be interpreted in the broadest sense. Transistors can also be bipolar transistors with collectors and emitters as main electrodes and bases as control electrodes, or other devices. The present invention is useful but not limited to CMOS-technology using P-channel FET ("P-FET") and N-channel FET ("N-FET"). The terms "first type" (e.g., for P-FET 110) and "second type" (e.g., for N-FET 120) are intended to distinguish complementary transistors of opposite conductivity. For convenience, the figures illustrate the gates (G) of P-FET by small circles. "First type" and "second type" can refer to either N or P regions, as the case may be.

(b) A "conductive" transistor is able to carry a current between its main electrodes; whereas a "non-conductive" transistor is substantially not able to carry a current. FETs are conductive when the absolute value $|V_{GS}|$ of the gate-source voltage $V_{GS}$ is substantially equal ($\approx$) or greater than (>) the absolute value $|V_t|$ of a transistor threshold voltage $V_t$, that is:

$$|V_{GS}| > \approx |V_t| \text{ (conductive)} \quad (1)$$

$$|V_{GS}| < |V_t| \text{ (non-conductive)}. \quad (2)$$

The use of absolute values for considering the voltages is convenient, because $V_{GS}$ and $V_t$ have different signs for transistors of different conductivity type. A person of skill in the art is able to apply the conventions to other transistors (e.g., to bipolar transistors).

(c) Circuit 100 has first line 101, second line 102, and third line 103. Lines 101, 102, and 103 are sometimes referred to as "node" or "nodes". The potential at these lines are first, second and third potentials, respectively. The potentials are labeled "VCCL" on line 101, "OUT" on line 102, and "GND" on line 103. Preferably, lines 101 and 103 receive a supply voltage |VCCL−GND|; and line 102 provides an output voltage |OUT−GND|. For convenience of explanation, it is assumed that GND is all the time at substantially zero volts, that is:

$$GND \approx 0, \quad (3)$$

but this is not essential. Magnitude relations between lines 101, 102 and 103 can vary. Operating modes of circuit 100 are distinguished by the magnitude relation between line 101 (first potential VCCL) and line 102 (second potential OUT). With the transistor configurations illustrated in the figures, VCCL is a positive voltage of, for example, VCCL=3.3 volts. When circuit 100 is switched off, then VCCL can become substantially equal to GND (VCCL≈GND) or VCCL can become floating. Further circuit 199 is coupled to circuit 100, for example, via lines 102 and 103. Preferably, further circuit 199 employs supply voltages VCCH greater than VCCL, that is:

$$VCCH > VCCL \quad (4)$$

As mentioned in the background section, further circuit 199 can temporarily pull line 102 to VCCH or above VCCH, where:

$$OUT > VCCH. \quad (5)$$

(d) For further explanation, it is convenient to define a first magnitude relation as:

$$VCCL > \approx OUT \quad (6)$$

wherein the first potential is substantially equal to (≈) or greater than (>) the second potential. Thereby, circuit 100 operates in a first operating mode. Accordingly, the second magnitude relation $$VCCL < OUT \quad (7)$$

defines the opposite. The second magnitude relation is also called "overvoltage condition". Circuit 100 operates in a second operating mode. This happens, for example, when circuit 100 is switched off or when circuit 199 pulls line 102 to VCCH (see equation (5)). The definitions are intended to be nonlimiting examples. Persons of skill in the art are able, based on the description herein, to implement circuits according to the present invention using other definitions.

(e) The term "up" is conveniently used to indicate a first direction towards line 101 with reference potential VCCL; "down" indicates a second, opposite direction towards line 103 with reference potential GND. For example, transistor 110 can pull up line 102 (at OUT) to line 101 (at VCCL); or transistor 120 can pull down line 102 to line 103 (at GND).

FIG. 1 is now explained in detail. Circuit 100 comprises pull-up transistor 110, optional pull-down transistor 120 (collectively "pull transistors"), input driver 200, and protection transistors 150, 160, 170 and 180. Protection transistors 150, 170 and 180 are optional. Protection transistors 150, 160, 170 and 180 form protection circuit 105 (dashed frame). Within protection circuit 105, transistors 170 and 160 form substrate driver 107 (also dashed frame). In connection with substrate driver 107, transistors 170 and 160 are also called "driver transistors". Driver 200 can be coupled to lines 101 and 103 and can have additional inputs (not shown).

The present invention has important advantages over the prior art. The physical dimensions (e.g., channel width and length) of protection transistors 150, 160, 170 and 180 are small in comparison to pull transistors 110 and 120. Preferably, all transistors are of an enhancement type and can be manufactured in common processing steps. Protection circuit 105 does not substantially not interfere with the signal characteristic, e.g., the AC/DC response of pull transistors 110 and 120. Latch-up effects and leakage currents are effectively prevented.

In the example of FIG. 1, transistors 110, 150, 160 and 180 are P-FETs; and transistors 120 and 170 are N-FETs. The transistors and the other mentioned elements of circuit 100 are coupled, preferably, as follows: The source (S) of transistor 110 is coupled to line 101. The substrate (B) of transistor 110 is coupled to substrate line 106. The drains (D) of transistors 110 and 120 are coupled together to line 102. The source (S) of transistor 120 is coupled to line 103. Input driver 200 is conveniently coupled to input line 104 for receiving an input signal IN. Input driver 200 is coupled to the gate (G) of transistor 110 via line 131 and to the gate (G) of transistor 120 via line 132. In protection circuit 105, the source (S) of optional transistor 180 is coupled to line 101. The drain (D) and the substrate (B) of transistor 180 are coupled to substrate line 106. The gate (G) of transistor 180 is coupled to line 102.

The drain (D) and the gate (G) of transistor 170 are coupled to line 101. The source (S) of transistor 170 is coupled to substrate line 106. The source (S) of transistor 150 is coupled to the gate (G) of transistor 110; the drain (D) is coupled to line 102; the gate (G) is coupled to line 101; and the substrate (B) is coupled to substrate line 106. The source (S) and the substrate (B) of transistor 160 are coupled to substrate line 106; the drain (D) is coupled to line 102; and the gate (G) is coupled to line 101. Optional line 106' couples substrate line 106 to input driver 200. But this is not essential. Details are explained in connection with FIG. 3.

Conveniently, input driver 200 receives input signal IN at input line 104. Input driver 200 controls pull-up transistor 110 by control signal C1 on line 131 and controls pull-down transistor 120 by control signal C2 on line 132. Assume, circuit 100 operates in the first operating mode (equation (6), VCCL>≈OUT). For C1≈GND, pull-up transistor 110 is conductive and pulls line 102 up to VCCL. OUT becomes substantially OUT≈VCCL. For C2≈VCCL, pull-down transistor 120 is conductive and pulls line 102 down to GND. OUT becomes substantially OUT≈GND. In a so-called tristate condition with C1≈VCCL and C2≈GND, transistors 110 and 120 are non-conductive and line 102 (at potential OUT) becomes floating.

Protection circuit 105 protects pull-up transistor 110. Persons of skill in the art are able, based on the description herein, to implement similar protection circuits for pull-down transistor 120. In the first operating mode (VCCL>≈OUT), conductive transistor 170 pulls substrate line 106 to line 101 at VCCL. Transistors 150 and 160 receive VCCL at their gates (G) and are non-conductive. Input driver 200 can control transistors 110 and 120 to pull line 102 up or down or have line 102 floating. This has no influence on protection circuit 105.

Assume now that an overvoltage condition occurs and that circuit 100 goes into the second operating mode (VCCL<OUT). Transistors 170 and 180 become nonconductive and release substrate line 106 from line 101. Transistors 150 and 160 become conductive. Transistor 160 pulls the potential at substrate line 106 to OUT which is the highest potential. Transistor 150 propagates potential OUT to the gate (G) of pull-up transistor 110. OUT overrides control signal C1 and pull-up transistor 110 stays non-conductive (if C1≈VCCL) or becomes non-conductive. Leakage current through pull-up transistor 110 is thereby prevented.

Figure 2:
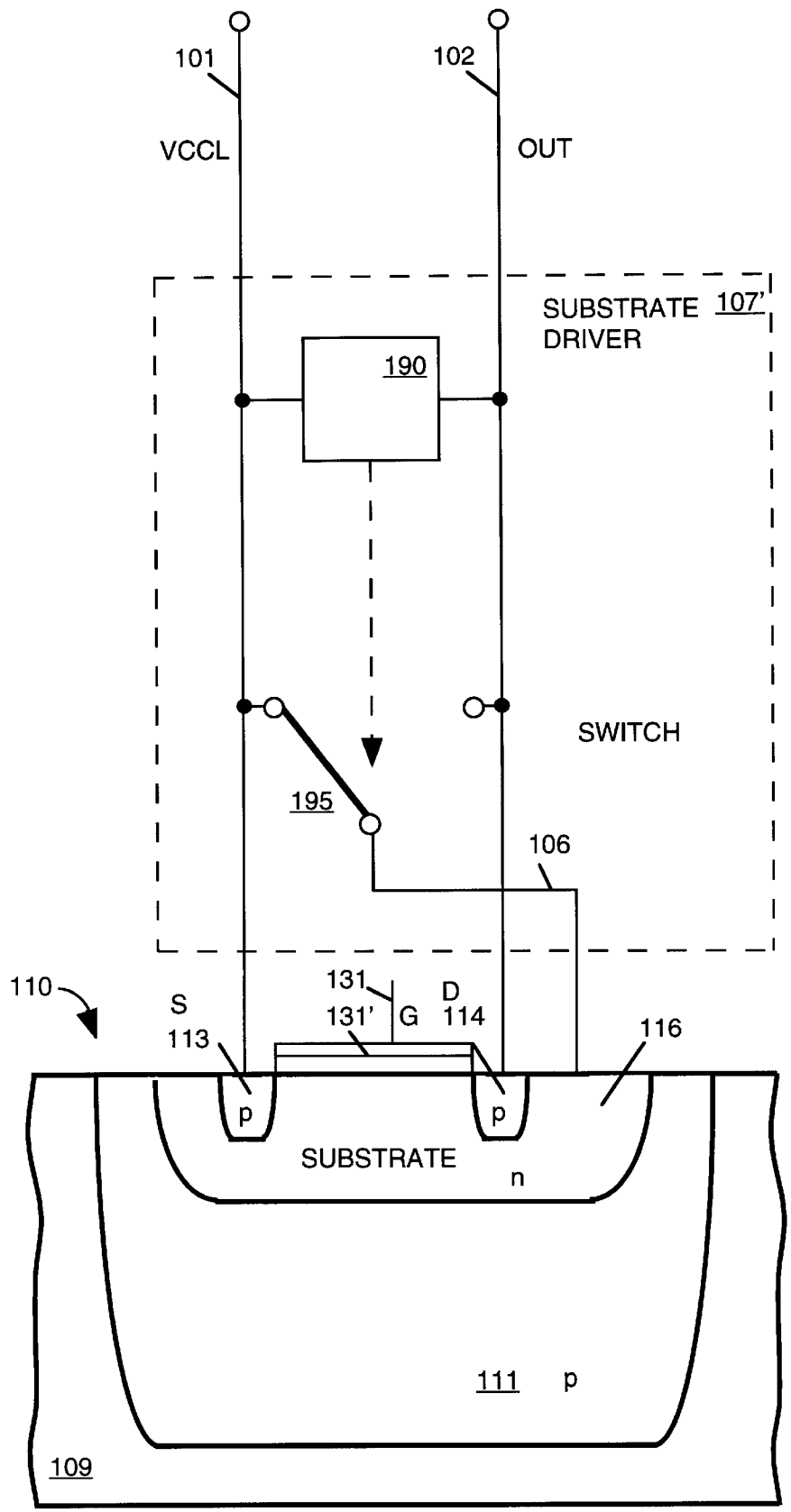
FIG. 2 is an elevation view in section of a semiconductor chip containing a pull transistor of the circuit of FIG. 1; and also illustrates a simplified block diagram of a substrate driver coupled to the pull transistor.

FIG. 2 is an elevation view in section of a semiconductor chip containing pull-up transistor 110 of circuit 100 of FIG. 1. FIG. 2 also illustrates a simplified block diagram of substrate driver 107' (dashed frame) coupled to transistor 110.

For example, transistor 110 is implemented on wafer 109 with P-doped tub 111 and N-doped region 116. P-doped tub 111 is optional and the entire wafer may comprise N-doped region 116 which is also referred to as "substrate". N-doped region 116 is coupled to substrate line 106 (cf. FIG. 1). Contact regions 113 and 114 are located on N-doped region 116. Contact regions 113 and 114 are, preferably, P-doped and serve as source (S) and drain (D), respectively. Gate 131' is oxide isolated above a channel which forms between contact regions 113 and 114. Gate 131' is preferably coupled to line 131 (cf. FIG. 1). Contact regions 113 and 114 are, preferably, coupled to lines 101 and 102 (cf. FIG. 1), respectively, and receive potentials VCCL and OUT, respectively.

Substrate driver 107' has switch 195 which couples substrate 116 (through substrate line 106) either to line 101 at potential VCCL or to line 102 at potential OUT. Switch 195 is controlled by comparator 190 (see dashed arrow). In the example of FIGS. 1–2, substrate driver 107 switches substrate 116 to (i) VCCL for VCCL>≈OUT, (first mode) or to (8)

(ii) OUT for VCCL <OUT (second mode, overvoltage). (9)

In other words, substrate driver 107' keeps substrate 116 at the highest voltage which is applied. This convention is applicable when transistor 110 is a P-FET. If transistor 110 would be an N-FET then substrate driver 107' keeps substrate 116 at the lowest voltage. Generally, during overvoltage conditions, substrate driver 107' prevents charge carriers (e.g., holes and electrons) from flowing through the channel formed under gate 131'.

Substrate driver 107' is conveniently implemented as substrate driver 107 (transistors 170 and 160) as explained in connection with FIG. 1. Switch 195 is implemented by transistors 170 and 160. One of transistors 160 and 170 is conductive and the other transistor is non-conductive. Comparator 190 is implemented by the magnitude relations of the gate-source voltages $|V_{GS}|$ of transistors 160 and 170 with respect to the differences between potentials VCCL and OUT. While FIG. 2 illustrates an N-well technology, it is understood that the features of the present invention are applicable to other technologies. For example, persons of skill in the art are able, based on the description herein, to implement transistor 110 with opposite doping.

Figure 3:
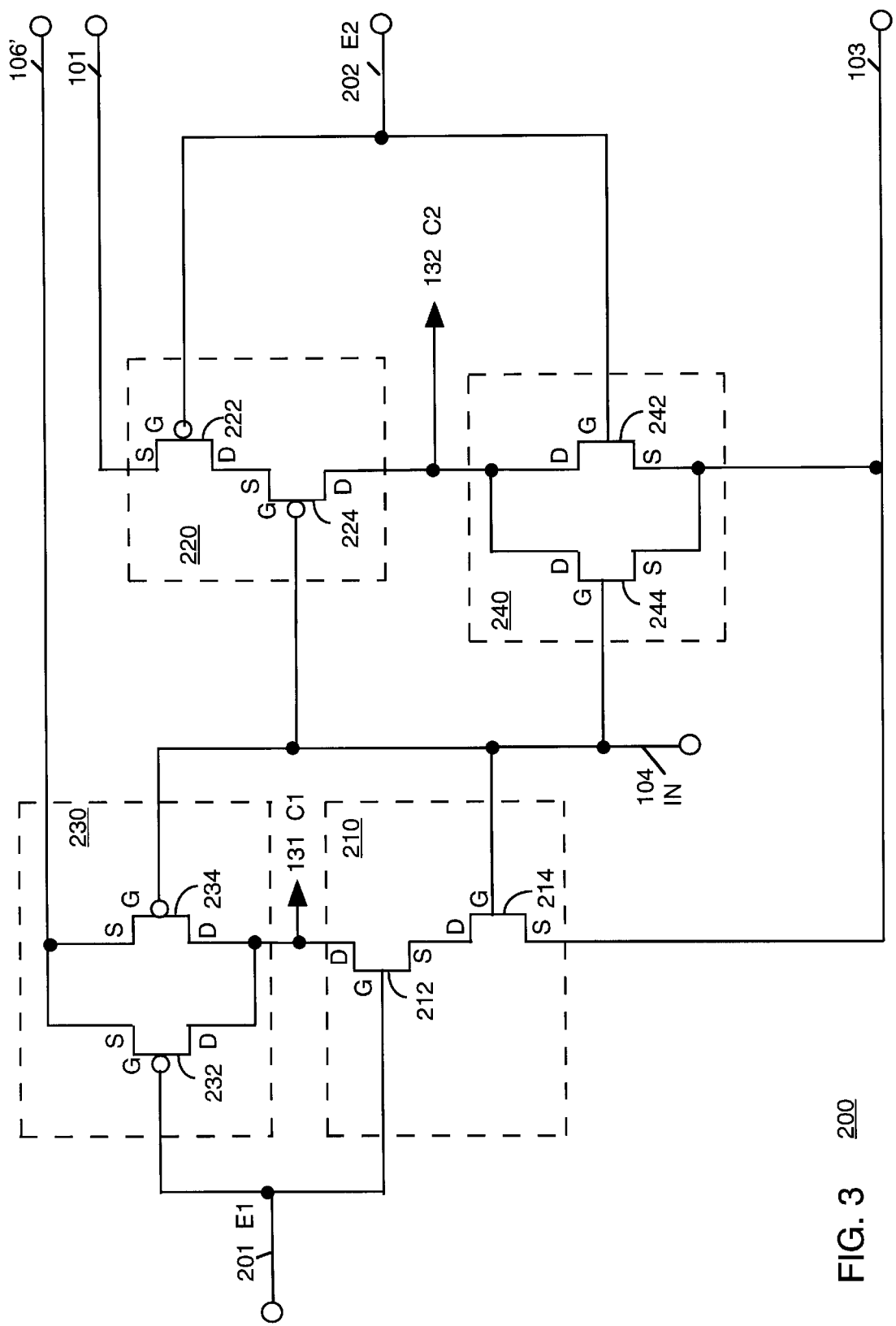
FIG. 3 is a simplified circuit diagram of an input driver optionally used in the circuit of FIG. 1.

FIG. 3 is a simplified circuit diagram of input driver 200 optionally used in circuit 100. Input driver 200 comprises transistors 232, 234, 222, 224 (P-FET) and transistors 212, 214, 242 and 244 (N-FET). In FIG. 3, lines 101, 103, 104, 106', 131, and 132 are as explained in connection with FIG. 1. Additionally, input driver 200 has line 201 for receiving enable signal E1 and line 202 for receiving enable signal E2. Dashed frames illustrate transistor arrangements 210, 220, 230 and 240. Transistors 212 and 214 form arrangement 210; transistors 222 and 224 form arrangement 220; transistors 232 and 234 form arrangement 230; and transistors 242 and 244 form arrangement 240.

In arrangement 210, the drain (D) of transistor 212 is coupled to line 131. The source (S) of transistor 212 is coupled to the drain (D) of transistor 214. The source (S) of transistor 214 is coupled to line 103. The gate (G) of transistor 212 receives enable signal E1 from line 201; and the gate (G) of transistor 214 receives input signal IN from line 104. In arrangement 220, the source (S) of transistor 222 is coupled to line 101. The drain (D) of transistor 222 is coupled to the source (S) of transistor 224. The drain (D) of transistor 224 is coupled to line 132. The gate (G) of transistor 222 receives enable signal E2 from line 202; and the gate (G) of transistor 224 receives input signal IN from line 104. In arrangement 230, the sources (S) of transistors 232 and 234 are coupled together to line 106'; and the drains (D) are coupled together to line 131. The gate (G) of transistor 232 receives enable signal E1 (line 201); and the gate (G) of transistor 234 receives input signal IN (line 104). In arrangement 240, the drains (D) of transistors 242 and 244 are coupled together to line 132; and the sources (S) are coupled together to line 103. The gate (G) of transistor 242 receives enable signal E2 (line 202); and the gate (G) of transistor 244 receives input signal IN (line 104). For simplicity, connections of substrate electrodes of the transistors are not shown.

When circuit 100 operates in the first mode (VCCL>≈OUT), then line 106' is substantially at the potential VCCL of line 101 (cf. transistor 170). Arrangement 210 provides C1≈GND (line 131) which causes transistor 110 to be conductive under the condition:

(E1=VCCL) and (IN≈VCCL) (10)

Transistors 212 and 214 are conductive and pull down line 131 to line 103. Arrangement 220 provides C2≈VCCL (line 132) which causes transistor 120 to be conductive under the condition:

(E2≈GND) and (IN≈GND) (11)

Transistors 222 and 214 are conductive and pull up line 132 to line 101. Conveniently, enable signals E1 and E2 are applied complementary. Signals E1 and E2 can be considered as a single enable signal. When E1≈VCCL and E2≈GND then circuit 100 is enabled. Output potential OUT (line 102) is the inversion of input signal IN.

Arrangements 230 and 240 disable circuit 100 as follows. Arrangement 230 provides C1≈VCCL causing transistor 110 to become non-conductive for:

(E1≈GND) or (IN≈GND) (12)

In that case, conductive transistors 232 and 234 pull up line 131 to line 101. Arrangement 240 provides C2 GND causing transistor 120 to become non-conductive for:

(E2≈VCCL) or (IN≈VCCL). (13)

Enable signals E1 and E2 can be controlled by circuitry well known in the art. It is possible to disable circuit 100 before circuit 100 goes into the second mode.

But efforts to control E1 and E2 are sometimes not convenient. Also, circuit 100 can go into the second mode unintentionally, by chance or due to a failure in circuit 199.

Figure 4:
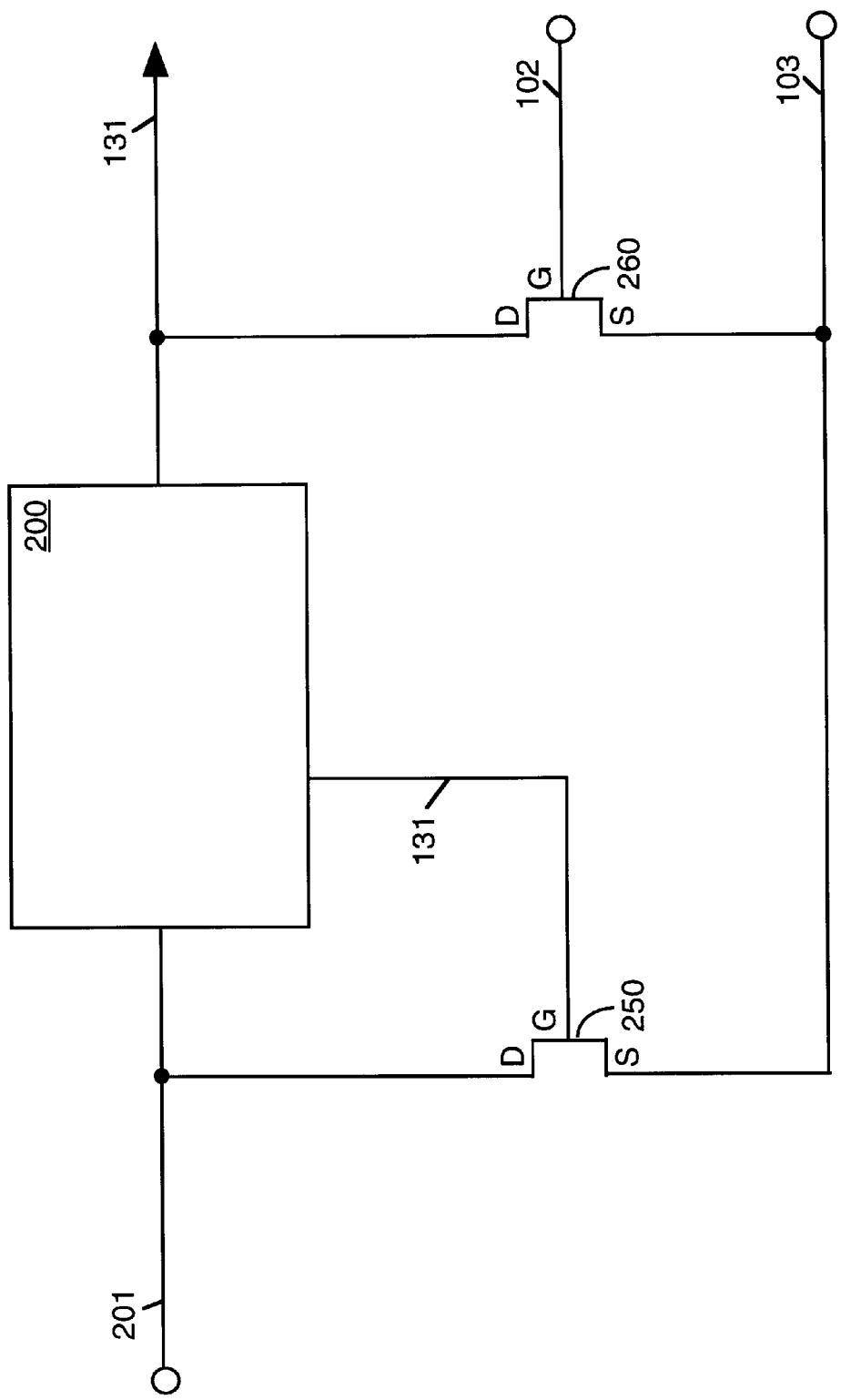
FIG. 4 is a simplified circuit diagram illustrating an optional transistor arrangement used in the circuit of FIG. 1.

FIG. 4 is a simplified circuit diagram illustrating optional transistor arrangement 250/260 used in circuit 100. Arrangement 250/260 disables transistors 110 and 120 when line 102 is either at potential VCCL or at GND but when line 101 is not at a defined potential. Such a situation arises for example, when circuit 100 is switched off and line 101 is disconnected from potential VCCL.

For convenience, FIG. 4 also illustrates lines 102, 103, 131, 132, and 201 and driver 200. Transistors 250 and 260 have sources (S) coupled to line 103. A drain (D) of transistor 250 is coupled to line 201 and a drain (D) of transistor 260 is coupled to line 132. A gate (G) of transistor 250 is coupled to line 131 and a gate (G) of transistor 260 is coupled to line 102. Preferably, transistors 250 and 260 are N-FETs.

Preferably, transistor 250 has less current carrying capacity than transistors 212, 214, 232 and 234 in arrangements 210 and 230 of input driver 200 (FIG. 3). Similarly, transistor 260 has less capacity than transistors 242, 244, 222 and 224 in arrangements 220 and 240 of input driver 200. Therefore, arrangement 220 pulls line 132 to line 101 (see equation (11)) and overrides transistor 260.

For disconnected line 101, arrangement 220 does not pull up line 132 with signal C2. Instead, transistor 260 pulls line 132 to line 103 (potential GND) so that transistor 120 is non-conductive. Also, transistor 250 pulls line 201 with E1 to line 103 so that arrangement 210 does not pull down line 131 (signal C1). Transistor 120 is therefore also non-conductive.

The operation of circuit 100 can be described as a method for protecting an output transistor (e.g., transistor 110) which is coupled between a first node (e.g., line 101) and a second node (e.g., line 102) from overvoltages when the second node assumes a higher potential than the first node (e.g., second mode). The method comprises the following steps:

(a) monitoring a difference between first and second nodes (e.g., between potentials VCCL and OUT); and (b) coupling a substrate electrode (e.g., substrate 116 on line 106) of the output transistor to the first node if the first node has a higher potential than the second node (cf. equation (8)) or to the second node if the second node has a higher potential than the first node (cf. equation (9)).

While the invention has been described in terms of particular structures, devices and methods, those of skill in the art will understand based on the description herein that it is not limited merely to such examples and that the full scope of the invention is properly determined by the claims that follow.

I claim:

1. A circuit with overvoltage protection, comprising:

a first node coupled for receiving a first source of operating potential;

a second node coupled for providing an output potential, OUT;

a first transistor having first and second main electrodes, a control electrode, and a substrate electrode, (a) said first main electrode coupled to said first node, (b) said second main electrode coupled to said second node and indirectly coupled for receiving a second source of operating potential, and (c) said control electrode coupled to a control terminal for receiving a control signal; and a second transistor having first and second main electrodes and a control electrode, (a) said first main electrode coupled to said substrate electrode of said first transistor, (b) said second main electrode coupled to said second node, and (c) said control electrode coupled to said first node, said second transistor protecting said first transistor by temporarily pulling said substrate of said first transistor to said second node so that said first transistor is made non-conductive;

a third transistor having first and second main electrodes, a control electrode, and a substrate electrode, (a) said first main electrode coupled to said control electrode of said first transistor, (b) said second main electrode coupled to said second node, (c) said control electrode coupled to said first node, and (d) said substrate electrode coupled to said substrate electrode of said first transistor.

2. The circuit of claim 1 wherein said first, second, and third transistors are field effect transistors (FET), said first main electrodes are sources (S)

said second main electrodes are drains (D), and said control electrodes are gates (G).

3. The circuit of claim 1 wherein said first operating potential is greater than or equal to said output potential under first operating conditions;

said output potential is less than said second potential under second operating conditions; and said second transistor pulls said substrate electrode of said first transistor to said second node under second operating conditions.

4. The circuit of claim 1 wherein (i) in a first operating mode, said first operating potential is in a first magnitude relation to said output potential, said second transistor is substantially non-conductive and a control signal at said control terminal makes said first transistor (a) conductive so that said first transistor pulls said second node to said first node or (b) not conductive so that said first transistor does not pull said second node to said first node; and (ii) in a second operating mode, said first operating potential is in a second magnitude relation to said output potential and said second transistor is substantially conductive so that said output potential and said second transistor is substantially conductive so that said output potential goes to said control electrode and to said substrate electrode of said first transistor and makes said first transistor substantially non-conductive.

5. The circuit of claim 4 wherein said first magnitude relation is that said first operating potential is greater than or substantially equal to said output potential, and said second magnitude relation is that said first operating potential is substantially smaller than said output potential.

6. The circuit of claim 1 wherein said substrate electrode of said first transistor is coupled to said first node by a switch.

7. The circuit of claim 6 wherein said switch is an arrangement of serially coupled transistors.

8. The circuit of claim 1 wherein said substrate electrode of said first transistor is coupled to said first node by a switch which is controlled from said second node.

9. The circuit of claim 1 further having an input driver for conditionally forwarding said control signal from said control terminal to said control electrode of said first transistor, said input driver receiving an enable signal.

10. The circuit of claim 1 further including:

a fourth transistor having first and second main electrodes and a control electrode, (a) said first main electrode coupled to said substrate electrode of said first transistor,

9

(b) said second main electrode coupled to said first node, and (c) said control electrode coupled to said first node.

11. The circuit of claim 10 further including:

a fifth transistor having first and second main electrodes, a control electrode, and a substrate electrode, (a) said first main electrode coupled to said first node, (b) said second main electrode coupled to said substrate electrode of said first transistor and to said substrate electrode of said fifth transistor, and (c) said control electrode coupled to said second node.

12. The circuit of claim 11 further including:

a sixth transistor having first and second main electrodes and a control electrode, (a) said first main electrode coupled to the second source of operating potential, (b) said second main electrode coupled to said second main electrode of said first transistor, and (c) said control electrode coupled for receiving a second control signal, wherein the second main electrode of the first transistor is indirectly coupled to the second source of operating potential via the sixth transistor.

13. The circuit of claim 1 further including:

a fourth transistor having first and second main electrodes, a control electrode, and a substrate electrode, (a) said first main electrode coupled to said first node, (b) said second main electrode coupled to said substrate electrode of said first transistor and to said substrate electrode of said fourth transistor, and (c) said control electrode coupled to said second node.

14. The circuit of claim 13 further including:

a fifth transistor having first and second main electrodes and a control electrode, (a) said first main electrode coupled to the second source of operating potential, (b) said second main electrode coupled to said second main electrode of said first transistor, and (c) said control electrode coupled for receiving a second control signal.

15. An apparatus comprising:

a first transistor having a substrate with a first doping, located on said substrate, a first contact region with a second, opposite doping and coupled for receiving a first potential, located on said substrate, a second contact region with said second doping and coupled for providing an output potential, and a third contact located between the first contact region and the second contact region and counted for receiving an input signal;

a substrate driver coupled for receiving said first potential and said output potential and coupling said substrate to either said first contact region or to said second contact region depending on a polarity of a difference between said first potential and said output potential, wherein a portion of said substrate driver is located in said substrate; and

10 a protection transistor having a first contact region located in said substrate, said first contact region with a second, opposite doping and coupled for receiving the input signal, a second contact region located in said substrate, said second contact region with said second doping and coupled for receiving the output potential, and a third contact located between said first region and said second contact region and coupled for receiving the first potential.

16. The apparatus of claim 15 wherein said first transistor and said protection transistor are field effect transistors with sources as said first contact regions, drains as said second contact regions, gates between said source and drain for controlling a current flow as said third contents.

17. The apparatus of claim 15 wherein (a) said substrate driver has serially coupled between said first contact region of said first transistor and said second contact region a first driver transistor and a second driver transistor, and (b) a node between said first driver transistor and said second driver transistor is coupled to said substrate, and (c) control electrodes of said first driver transistor and said second driver transistor are coupled together to either said first contact region or said second contact region of said first transistor.

18. The apparatus of claim 17 wherein said first driver transistor is of a first conductivity type and said second driver transistor is of a second, opposite conductivity type.

19. The apparatus of claim 15 wherein (a) said substrate driver has first and second driver transistors serially coupled between said first contact region and said second contact region and (b) a node between said first and second driver transistors is coupled to said substrate and (c) control electrodes of said first and second driver transistors are cross coupled to said first contact region and to said second contact region of said first transistor, respectively.

20. The apparatus of claim 15 wherein (i) said substrate has N-doping, said first and second contact regions have P-doping, (ii) if said first potential is greater than or equal to said output potential, said substrate driver couples said substrate for receiving said first potential, and (iii) if said first potential is less than said output potential, said substrate driver couples said substrate to said output potential.

21. The apparatus of claim 15 wherein said first transistor is a P-FET having a source as said first contact region and a drain as said second contact region, said substrate driver has an N-FET and a P-FET, each FET with a source (S), a drain (D), and a gate (G), said drain and said gate of said N-FET and said gate of said P-FET coupled for receiving said first potential, said source of said N-FET and said source of said P-FET being coupled to said substrate, and said drain of said P-FET coupled for receiving said second potential.

* * * * *

UNITED STATES PATENT AND TRADEMARK OFFICE
CERTIFICATE OF CORRECTION

PATENT NO. : 5,966,038  
DATED : October 12, 1999  
INVENTOR(S) : Jiri Langer

Page 1 of 1

It is certified that error appears in the above-identified patent and that said Letters Patent is hereby corrected as shown below:

Column 9,  
Line 57, delete "counted" and replace with -- coupled --.

Column 10,  
Line 17, delete "contents" and replace with -- contacts --.

Signed and Sealed this

Thirtieth Day of April, 2002

Attest:

JAMES E. ROGAN  
Attesting Officer  Director of the United States Patent and Trademark Office